United States Patent
Miyahara et al.

(10) Patent No.: US 9,793,376 B2
(45) Date of Patent: Oct. 17, 2017

(54) SILICON CARBIDE SEMICONDUCTOR DEVICE AND METHOD OF MANUFACTURING THE SAME

(71) Applicants: DENSO CORPORATION, Kariya, Aichi-pref. (JP); Jun Morimoto, Toyota-shi, Aichi-ken (JP)

(72) Inventors: Shinichiro Miyahara, Nagoya (JP); Toshimasa Yamamoto, Ichinomiya (JP); Jun Morimoto, Nisshin (JP); Narumasa Soejima, Seto (JP); Yukihiko Watanabe, Nagoya (JP)

(73) Assignees: DENSO CORPORATION, Kariya (JP); TOYOTA JIDOSHA KABUSHIKI KAISHA, Toyota-shi (JP)

( * ) Notice: Subject to any disclaimer, the term of this patent is extended or adjusted under 35 U.S.C. 154(b) by 23 days.

(21) Appl. No.: 14/415,752

(22) PCT Filed: Aug. 6, 2013

(86) PCT No.: PCT/JP2013/004735
§ 371 (c)(1),
(2) Date: Jan. 20, 2015

(87) PCT Pub. No.: WO2014/024469
PCT Pub. Date: Feb. 13, 2014

(65) Prior Publication Data
US 2015/0236127 A1    Aug. 20, 2015

(30) Foreign Application Priority Data

Aug. 7, 2012  (JP) .................................. 2012-174948
Jul. 29, 2013  (JP) .................................. 2013-156393

(51) Int. Cl.
*H01L 31/0312*    (2006.01)
*H01L 29/66*    (2006.01)
(Continued)

(52) U.S. Cl.
CPC ...... *H01L 29/66734* (2013.01); *H01L 21/049* (2013.01); *H01L 21/28158* (2013.01);
(Continued)

(58) Field of Classification Search
CPC ............ H01L 29/66734; H01L 21/049; H01L 21/28158; H01L 21/30604; H01L 29/045; H01L 29/1095
(Continued)

(56) References Cited

U.S. PATENT DOCUMENTS 5,200,355 A * 4/1993 Choi ................... H01L 27/1126
257/391
5,977,564 A * 11/1999 Kobayashi ............ H01L 29/045
257/18
(Continued)

FOREIGN PATENT DOCUMENTS

JP    11-186248 A    7/1999
JP    11-204517 A    7/1999
(Continued)

OTHER PUBLICATIONS

International Search Report of the International Searching Authority mailed Nov. 12, 2013 in the corresponding International application No. PCT/JP2013/004735 (and English translation).
(Continued)

*Primary Examiner* — Ori Nadav
(74) *Attorney, Agent, or Firm* — Posz Law Group, PLC

(57) ABSTRACT

In a method of manufacturing a silicon carbide semiconductor device including a vertical switching element having a trench gate structure, with the use of a substrate having an
(Continued)

off angle with respect to a (0001) plane or a (000-1) plane, a trench is formed from a surface of a source region to a depth reaching a drift layer through a base region so that a side wall surface of the trench faces a (11-20) plane or a (1-100) plane, and a gate oxide film is formed without performing sacrificial oxidation after formation of the trench.

5 Claims, 7 Drawing Sheets

(51) Int. Cl.
*H01L 29/16* (2006.01)
*H01L 29/78* (2006.01)
*H01L 29/423* (2006.01)
*H01L 21/306* (2006.01)
*H01L 21/04* (2006.01)
*H01L 21/28* (2006.01)
*H01L 29/04* (2006.01)
*H01L 29/10* (2006.01)

(52) U.S. Cl.
CPC ...... *H01L 21/30604* (2013.01); *H01L 29/045* (2013.01); *H01L 29/1095* (2013.01); *H01L 29/1608* (2013.01); *H01L 29/4236* (2013.01); *H01L 29/7813* (2013.01)

(58) Field of Classification Search
USPC .......................................... 257/77, 627, 628
See application file for complete search history.

(56) References Cited

U.S. PATENT DOCUMENTS

| | | | |
|---|---|---|---|
| 6,797,323 | B1 | 9/2004 | Kashiwagi et al. |
| 7,700,441 | B2* | 4/2010 | Kim ................. H01L 21/82345 257/E21.419 |
| 8,148,749 | B2* | 4/2012 | Grebs .................. H01L 23/544 257/172 |
| 2004/0124461 | A1* | 7/2004 | Gajda ................. H01L 29/4933 257/330 |
| 2005/0233539 | A1 | 10/2005 | Takeuchi et al. |
| 2009/0050898 | A1 | 2/2009 | Tanimoto et al. |
| 2009/0311839 | A1 | 12/2009 | Miyahara et al. |
| 2012/0064731 | A1 | 3/2012 | Tanimoto et al. |
| 2012/0161154 | A1 | 6/2012 | Mimura et al. |
| 2013/0309859 | A1 | 11/2013 | Tanimoto et al. |
| 2013/0309877 | A1 | 11/2013 | Tanimoto et al. |

FOREIGN PATENT DOCUMENTS

| | | |
|---|---|---|
| JP | 2000-068266 A | 3/2000 |
| JP | 2002-261275 A | 9/2002 |
| JP | 2009-130069 A | 6/2009 |
| JP | 2010-238725 A | 10/2010 |

OTHER PUBLICATIONS

Written Opinion of the International Searching Authority mailed Nov. 11, 2013 in the corresponding International application No. PCT/JP2013/004735 (and English translation).

* cited by examiner

SILICON CARBIDE SEMICONDUCTOR DEVICE AND METHOD OF MANUFACTURING THE SAME

CROSS REFERENCE TO RELATED APPLICATIONS

The present disclosure is a U.S. national stage application of International Patent Application No. PCT/JP2013/004735 filed on Aug. 6, 2013 and is based on Japanese Patent Application No. 2012-174948 filed on Aug. 7, 2012 and Japanese Patent Application No. 2013-156393 filed on Jul. 29, 2013, the entire contents of which are incorporated herein by reference.

TECHNICAL FIELD

The present disclosure relates to a silicon carbide (hereinafter referred to as "SiC") semiconductor device having a vertical switching element with a trench gate structure, and a method of manufacturing the same.

BACKGROUND

Conventionally, as an SiC semiconductor device used as a switching element, a vertical power MOSFET having a trench gate structure in which a gate electrode is formed within a trench through a gate insulating film has been proposed (for example, refer to PTL 1). In the vertical power MOSFET, a gate voltage is applied to a gate electrode formed within a trench through a gate insulating film to form an inversion type channel in a p type base region located on a trench side surface, and a current is allowed to flow between a source electrode and a drain electrode.

The trench gate structure in a vertical power MOSFET configured in this way will be formed as follows. After a p type base region and an $n^+$ type source region have been formed on an $n^-$ type drift layer, a trench that penetrates the p type base region and the $n^+$ type source region is formed by etching. As a process of removing a damage in trench etching, after conducting a sacrificial oxidation process of removing a sacrificial oxide film after forming the sacrificial oxide film, a gate oxide film is formed by thermally oxidizing an inner wall surface of the trench. Then, after forming polysilicon on a surface of the gate oxide film in the trench, a gate electrode is formed by patterning. A trench gate structure is formed by the above method.

However, the present inventors have found that when the trench gate structure is formed by the above method, the reliability of the gate oxide film is poor. Specifically, it has been confirmed that a leakage current increases on a trench end.

PATENT LITERATURE

PTL 1: JP-A-2005-328013

SUMMARY

An object of the present disclosure is to provide an SiC semiconductor device which suppresses the occurrence of a leakage current, and has higher reliability of the gate oxide film, and to provide a manufacturing method of an SiC semiconductor device.

A manufacturing method of a silicon carbide semiconductor device according to one aspect of the present disclosure is a method of manufacturing a silicon carbide semiconductor device having an inversion type vertical switching element with a trench gate structure. The silicon carbide semiconductor device includes a substrate, a drift layer, a base region, a source region, a trench, a gate insulating film, a gate electrode, a source electrode, and a drain electrode.

The substrate is made of silicon carbide of a first or second conductivity type, a main surface of which is a (0001) plane or a (000-1) plane, or has an off angle with respect to the (0001) plane or the (000-1) plane. The drift layer is formed on the substrate, and is made of silicon carbide of the first conductivity type which is lower in impurity concentration than the substrate. The base region is formed on the drift layer, and is made of silicon carbide of the second conductivity type. The source region is formed on an upper portion of the base region, and is made of silicon carbide of the first conductivity type which is higher in concentration than the drift layer. The trench is formed from a surface of the source region to a depth reaching the drift layer through the base region, and a side wall surface of which is formed toward a (11-20) plane or a (1-100) plane. The gate insulating film is formed on an inner wall surface of the trench. The gate electrode is formed on the gate insulating film within the trench. The source electrode is electrically connected to the source region and the base region. The drain electrode is formed on a rear surface side of the substrate.

In the silicon carbide semiconductor device, an applied voltage to the gate electrode is controlled to form a channel region of the inversion type on a surface portion of the base region located on a side surface of the trench, and a current is allowed to flow between the source electrode and the drain electrode through the source region and the drift layer.

In the method of manufacturing the silicon carbide semiconductor device, the trench is formed by etching, and the gate insulating film is formed on the surface of the trench without performing sacrificial oxidation after forming the trench.

In the method of manufacturing the silicon carbide semiconductor device, the gate insulating film is formed without performing sacrificial oxidation after forming the trench. For that reason, the silicon carbide semiconductor device can be manufactured without being affected by the sacrificial oxidation, can suppress leakage current from being generated partially in the trench gate structure, and is higher in reliability of the gate insulating film.

A manufacturing method of a silicon carbide semiconductor device according to another aspect of the present disclosure is a method of manufacturing a silicon carbide semiconductor device having an inversion type vertical switching element with a trench gate structure. The silicon carbide semiconductor device includes a substrate, a drift layer, a base region, a source region, a trench, a gate insulating film, a gate electrode, a source electrode, and a drain electrode.

The substrate is made of silicon carbide of a first or second conductivity type, a main surface of which is a (0001) plane or a (000-1) plane, or has an off angle with respect to the (0001) plane or the (000-1) plane. The drift layer is formed on the substrate, and is made of silicon carbide of the first conductivity type which is lower in impurity concentration than the substrate. The base region is formed on the drift layer, and is made of silicon carbide of the second conductivity type. The source region is formed on an upper portion of the base region, and is made of silicon carbide of the first conductivity type which is higher in concentration than the drift layer. The trench is formed from a surface of the source region to a depth reaching the drift layer through the base region, and a side wall surface of which is formed toward a (11-20) plane or a (1-100) plane. The gate insulating film is formed on an inner wall surface of the trench. The gate electrode is formed on the gate insulating film within the trench. The source electrode is electrically connected to the source region and the base region. The drain electrode is formed on a rear surface side of the substrate.

In the silicon carbide semiconductor device, an applied voltage to the gate electrode is controlled to form a channel region of the inversion type on a surface portion of the base region located on a side surface of the trench, and a current is allowed to flow between the source electrode and the drain electrode through the source region and the drift layer.

In the method of manufacturing the silicon carbide semiconductor device, the trench is formed by etching, chemical dry etching using a gas containing $CF_4$ and $O_2$ is performed to remove any damage after forming the trench, and the gate insulating film is formed on the surface of the trench without performing sacrificial oxidation after removing the damage.

In the method of manufacturing the silicon carbide semiconductor device, the gate insulating film is formed on the surface of the trench without performing sacrificial oxidation after removing the damage by the chemical dry etching. For that reason, the silicon carbide semiconductor device can be manufactured without being affected by the sacrificial oxidation, can suppress leakage current from being generated partially in the trench gate structure, and is higher in reliability of the gate insulating film.

A silicon carbide semiconductor device according to another aspect of the present disclosure is a silicon carbide semiconductor device having an inversion type vertical switching element with a trench gate structure, and includes a substrate, a drift layer, a base region, a source region, a trench, a gate insulating film, a gate electrode, a source electrode, and a drain electrode. The substrate is made of silicon carbide of a first or second conductivity type, a main surface of which is a (0001) plane or a (000-1) plane, or has an off angle with respect to the (0001) plane or the (000-1) plane. The drift layer is formed on the substrate, and is made of silicon carbide of the first conductivity type which is lower in impurity concentration than the substrate. The base region is formed on the drift layer, and is made of silicon carbide of the second conductivity type. The source region is formed on an upper portion of the base region, and is made of silicon carbide of the first conductivity type which is higher in concentration than the drift layer. The trench is formed from a surface of the source region to a depth reaching the drift layer through the base region. A side wall surface of the trench is formed toward a (11-20) plane or a (1-100) plane. In the side wall surface, at least the side wall surface on which a channel region is formed has an angle of 84 degrees or larger with respect to the (0001) plane or the (000-1) plane. The gate insulating film is formed on an inner wall surface of the trench. The gate electrode is formed on the gate insulating film within the trench. The source electrode is electrically connected to the source region and the base region. The drain electrode is formed on a rear surface side of the substrate.

In the silicon carbide semiconductor device, an applied voltage to the gate electrode is controlled to form the channel region of the inversion type on a surface portion of the base region located on a side surface of the trench, and a current is allowed to flow between the source electrode and the drain electrode through the source region and the drift layer.

As described above, since the side wall surface on which at least the channel region is formed is at the angle of 84 degrees or larger with respect to the (0001) plane or the (000-1) plane, the leakage current can be suppressed. For that reason, there can be provided the silicon carbide semiconductor device which is higher in the reliability of the gate insulating film.

A silicon carbide semiconductor device according to another aspect of the present disclosure is a silicon carbide semiconductor device having an inversion type vertical switching element with a trench gate structure, and includes a substrate, a drift layer, a base region, a source region, a trench, a gate insulating film, a gate electrode, a source electrode, and a drain electrode. The substrate is made of silicon carbide of a first or second conductivity type, a main surface of which is a (0001) plane or a (000-1) plane, or has an off angle with respect to the (0001) plane or the (000-1) plane. The drift layer is formed on the substrate, and is made of silicon carbide of the first conductivity type which is lower in impurity concentration than the substrate. The base region is formed on the drift layer, and is made of silicon carbide of the second conductivity type. The source region is formed on an upper portion of the base region, and is made of silicon carbide of the first conductivity type which is higher in concentration than the drift layer. The trench is formed from a surface of the source region to a depth reaching the drift layer through the base region. A side wall surface of the trench is formed toward a (11-20) plane or a (1-100) plane, and a step at a boundary position between the source region and the base region in the side wall surface is 10 nm or smaller. The gate insulating film is formed on an inner wall surface of the trench. The gate electrode is formed on the gate insulating film within the trench. The source electrode is electrically connected to the source region and the base region. The drain electrode is formed on a rear surface side of the substrate.

In the silicon carbide semiconductor device, an applied voltage to the gate electrode is controlled to form a channel region of the inversion type on a surface portion of the base region located on a side surface of the trench, and a current is allowed to flow between the source electrode and the drain electrode through the source region and the drift layer.

In the case of forming the gate insulating film without performing a sacrificial oxidation process, the step at the boundary position between the source region and the base region in the side wall surface of the trench is 10 nm or smaller. The above structure enables the suppression of leakage current. For that reason, there can be provided the silicon carbide semiconductor device which can suppress the leakage current, and is higher in the reliability of the gate insulating film.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

The present inventors have diligently studied the cause of the above problems. As a result, it is clarified that the above problem occurs due to the sacrificial oxidation process performed before forming a gate oxide film. The details of the mechanism in which the above problem occurs by performing a sacrificial oxidation process are not proved. However, such a fact that when the sacrificial oxidation process is conducted as a process immediately before formation of the gate oxide film, a leakage increases at the trench end has been confirmed. When the gate oxide film is formed without performing the sacrificial oxidation process, or when even if the sacrificial oxidation process is conducted, chemical dry etching (hereinafter referred to as "CDE") is thereafter performed, and then the gate oxide film is formed, an increase in the leakage on the trench ends can be suppressed.

Figure 4:
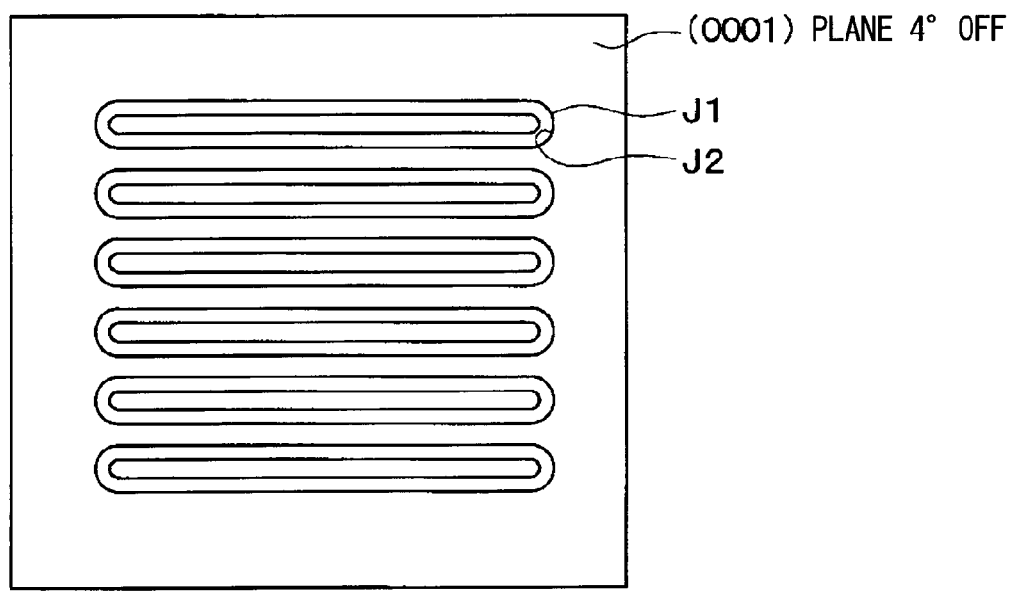
FIG. 4 is a top view of a vertical MOSFET showing a layout of a trench gate structure which is used to investigate leakage current characteristics.

Specifically, in order to investigate the leakage characteristics, as illustrated in FIG. 4, an oval trench gate structure J1 is formed into plural stripes with the use of an SiC substrate having an off angle with respect to a (0001) plane. The oval trench gate structure J1 is of a structure in which linear trench gate structures J1 each having one direction as a longitudinal direction adjacent to each other are paired, and both ends of the respective paired trench gate structures J1 are coupled to each other in an arc shape. In order to uniform the characteristics of a long side portion of the trench gate structure J1, an off-axis direction of the SiC substrate (that is, a direction parallel to a line at which the (0001) plane intersects with a flat surface perpendicular to the plane) is allowed to match the long side portion of the trench gate structure J1 when viewed from above the SiC substrate.

In a vertical MOSFET of the trench gate structure J1, a positive bias (for example, about 40 V) is applied to a gate electrode, a source electrode and a drain electrode are connected to GND, an emission image is confirmed to confirm the leakage characteristics. As a result, the emission image illustrated in FIG. 5 is obtained.

Since light is emitted at positions of both leading ends of the trench gate structure J1 due to the emission image, it is found that the leakage increases at both leading ends of the trench gate structure J1. When the amount of light emission of the emission image is confirmed, it is found that one end (right side end of a paper plane in FIG. 5) of the trench gate structure J1 is larger than the other end thereof (left side end of the paper plane in FIG. 5), and the leakage current is larger.

Figure 6A:
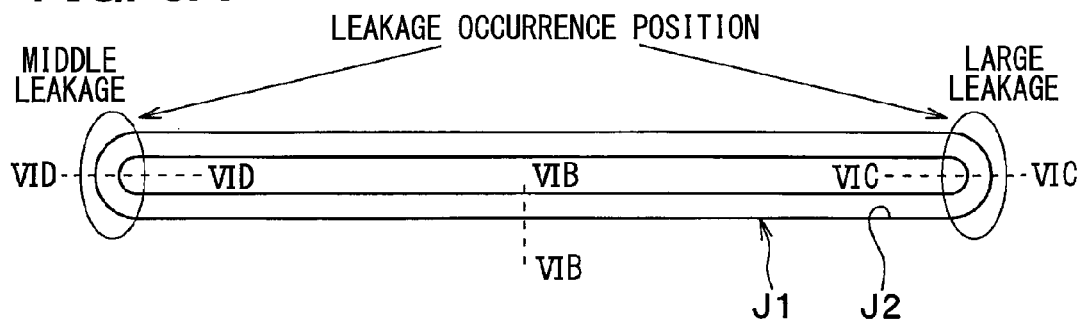
FIG. 6A is a top view of the vertical MOSFET showing a relationship between the trench gate structure and a leakage occurrence position.
Figure 6B:
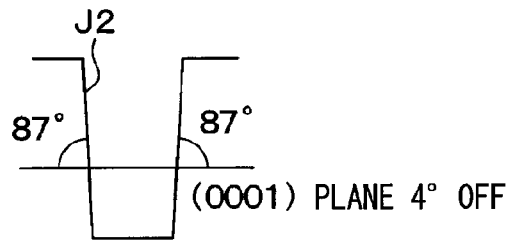
FIG. 6B is a diagram illustrating an angular relationship of a side wall surface of the trench in a section VIB-VIB of FIG. 6A.
Figure 6C:
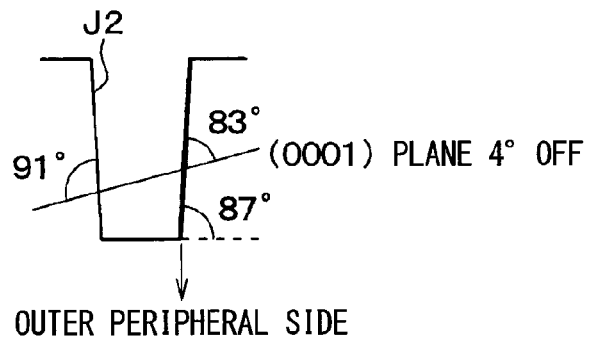
FIG. 6C is a diagram illustrating an angular relationship of a side wall surface of the trench in a section VIC-VIC of FIG. 6A.
Figure 6D:
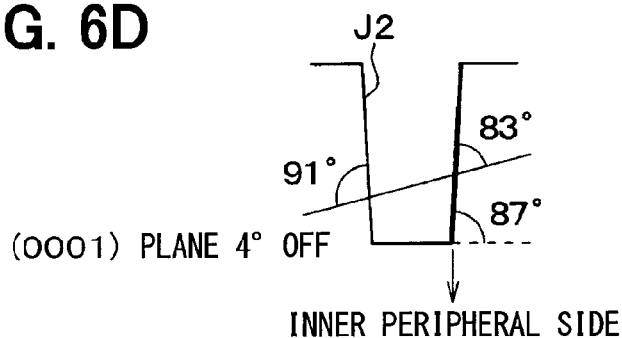
FIG. 6D is a diagram illustrating an angular relationship of a side wall surface of the trench in a section VID-VID of FIG. 6A.

In order to investigate the cause of the leakage current, a relationship between a shape of the trench gate structure J1 and angles formed between the respective inner wall surfaces of a trench J2 and a substrate plane direction or the (0001) plane, and the leakage occurrence positions is investigated. As a result, as shown in FIG. 6A and FIG. 6B, in the long side portion of the trench gate structure J1, since the long side portion and the off-axis direction are made to match each other when viewed from above the SiC substrate, an angle formed between the (0001) plane and a side wall surface of the trench J2 is 87 degrees. In contrast, as illustrated in FIG. 6C, in one (right side end of the paper plane in the figure) of both arcuate ends of the trench gate structure J1, a side wall surface of an inner peripheral side has an angle of 91 degrees with respect to the (0001) plane, and a side wall surface of an outer peripheral side has an angle of 83 degrees with respect to the (0001) plane. Also, as illustrated in FIG. 6D, in the other end (left side end of the paper plane in the figure) of the trench gate structure J1, a side wall surface of an inner peripheral side has an angle of 83 degrees with respect to the (0001) plane, and a side wall surface of an outer peripheral side has an angle of 91 degrees with respect to the (0001) plane.

Figure 5:
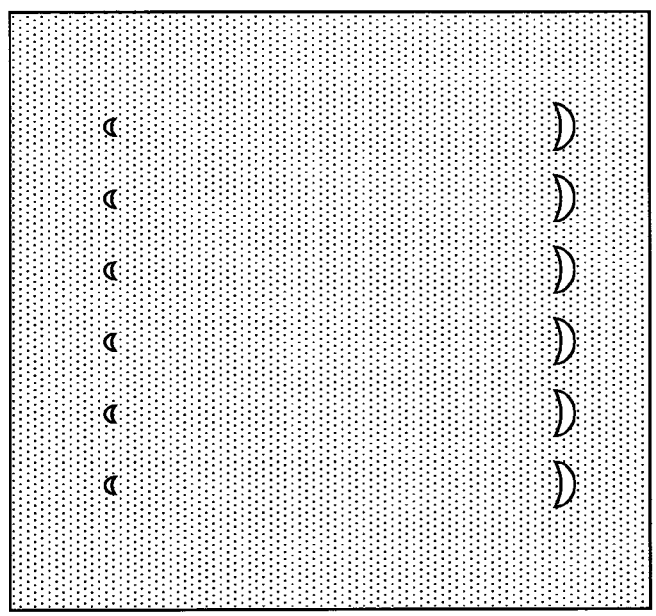
FIG. 5 is a diagram illustrating the result of examining the emission image when forming a gate oxide film after performing a sacrificial oxidation process after forming the trench.
Figure 7:
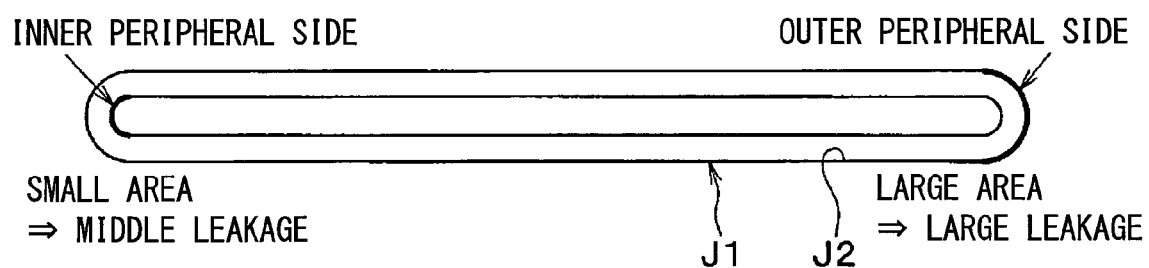
FIG. 7 is a top view of the vertical MOSFET showing a relationship between the trench gate structure and the leakage occurrence position.

It is estimated on the basis on the results illustrated in FIG. 5 that a leakage on the right side end of the paper plane in the figure in the trench gate structure J1 occurs in an area more extensive than the left side end of the paper plane. When considering also the results illustrated in FIG. 6A to FIG. 6D, it is estimated that the leakage occurs at the position forming an angle of 83 degrees with respect to the (0001) plane, that is, as illustrated in FIG. 7, the outer peripheral side on the right side end of the paper plane in the trench gate structure J1, and the inner peripheral side on the left side end of the paper plane. The details of this mechanism are not proved. However, when the sacrificial oxidation process is conducted as a process immediately before formation of the gate oxide film, a leakage increases at the end of the trench J2. When the gate oxide film is formed without performing the sacrificial oxidation process, or when even if the sacrificial oxidation process is conducted, CDE is thereafter performed to form the gate oxide film, an increase in the leakage on the end of the trench J2 can be suppressed.

As a result, in a place of the side wall surface of the trench J2 where the angle formed with the (0001) plane is 83 degrees or smaller, leakage current is generated when the sacrificial oxidation process is conducted immediately before forming the gate oxide film, and in a place where the angle exceeds 83 degrees, no leakage current is generated.

The above respective angles are obtained in an example where trench etching is conducted so that the angles formed by the respective side wall surfaces of the trench J2 to a bottom surface of the trench J2 become about 87 degrees. The angles formed by the respective side wall surfaces of the trench J2 to the bottom surface of the trench J2 can be set to 90 degrees, but if the angles exceed 90 degrees, such a disadvantage that the characteristic variation of the MOSFET becomes large may occur. For that reason, the above angle is set to 87 degrees so as not to exceed 90 degrees even if an etching error occurs. However, the trench etching may be conducted so that the angles formed by the respective side wall surfaces of the trench J2 to the bottom surface of the trench J2 are set to 90 degrees or another angle close to 90 degrees.

Hereinafter, embodiments of the present invention will be described with reference to the drawings. In the following respective embodiments, parts identical with or equivalent to each other are denoted by the same symbols in the drawings.

(First Embodiment)

A first embodiment of the present invention will be described. In this example, a vertical switching element having a trench gate structure will be exemplified by an SiC semiconductor device in which an inversion type MOSFET is formed.

Figure 1:
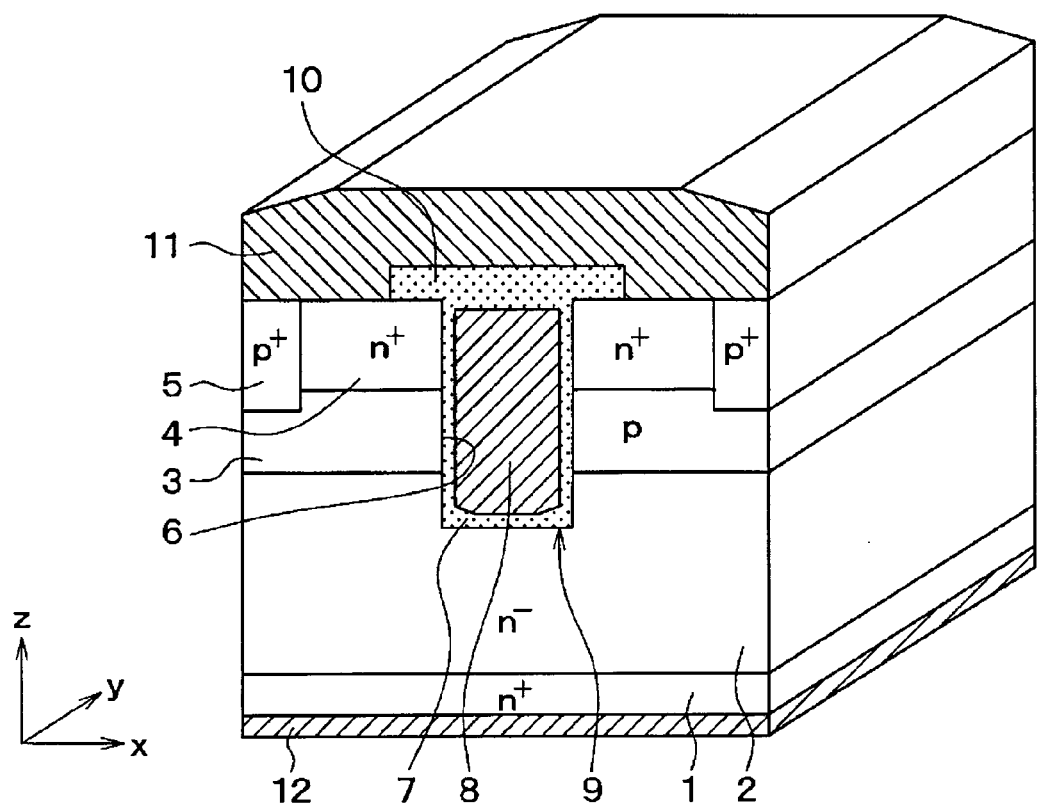
FIG. 1 is a cross-sectional perspective view illustrating an SiC semiconductor device according to a first embodiment of the present disclosure.

As illustrated in FIG. 1, an inversion type MOSFET of an n channel type is formed in the SiC semiconductor device. MOSFETs having the same structure as that of the MOSFET illustrated in the figure are arranged in plural rows adjacent to each other to configure the MOSFETs of plural cells. Specifically, a semiconductor substrate is formed of an $n^+$ type substrate 1 made of SiC, and the respective components of the MOSFET are formed over the $n^+$ type substrate 1 to configure the MOSFET.

The $n^+$ type substrate 1 is formed of an SiC substrate provided with an off angle of, for example, 4 degrees with respect to the (0001) plane, an n type impurity concentration such as nitrogen is, for example, $1.0 \times 10^{19}/cm^3$, and a thickness is about 300 μm. An $n^-$ type drift layer 2 made of SiC which is, for example, $3.0 \times 10^{15}$ to $2.0 \times 10^{16}/cm^3$ in n type impurity concentration such as nitrogen, and about 10 to 15 μm in thickness is formed on a surface of the $n^+$ type substrate 1. Since the crystallinity of the $n^-$ type drift layer 2 is the same as the $n^+$ type substrate 1, the surface of the $n^-$ type drift layer 2 is also provided with an off angle of 4 degrees with respect to the (0001) plane.

A p type base region 3 is formed on a surface layer portion of the $n^-$ type drift layer 2, and an $n^+$ type source region 4 and $p^+$ type contact layers 5 are formed on an upper layer portion of the p type base region 3.

The p type base region 3 is for example, $1.0 \times 10^{16}$ to $2.0 \times 10^{19}/cm^3$ in p type impurity concentration such as boron or aluminum, and about 2.0 μm in thickness. The $n^+$ type source region 4 is for example, $1.0 \times 10^{21}/cm^3$ in n type impurity concentration (surface concentration) such as nitrogen on the surface layer portion, and about 0.3 μm in thickness. Each of the $p^+$ type contact layers 5 is, for example, $1.0 \times 10^{21}/cm^3$ in p type impurity concentration (surface concentration) such as boron or aluminum on the surface layer portion, and about 0.3 μm in thickness. The $n^+$ type source region 4 is arranged on both sides of a trench gate structure 9 which will be described later, and the $p^+$ type contact layer 5 is disposed on a side of the $n^+$ type source region 4 opposite to the trench gate structure 9.

Also, a structure that penetrates through the p type base region 3 and the $n^+$ type source region 4, reaches the $n^-$ type drift layer 2, and has a bottom of a predetermined width, for example, the trench 6 that is 0.5 to 2.0 μm in width and 2.0 μm or higher (for example, 2.4 μm) in depth is formed. The p type base region 3 and the $n^+$ type source region 4 described above are arranged in contact with the side surface of the trench 6.

The trench 6 is formed with an x-direction in FIG. 1 as a width direction, a y-direction as a longitudinal direction, and a z-direction as a depth direction, and a plurality of the trenches 6 is arrayed in the x-direction in FIG. 1 in which the respective trenches 6 are arrayed in parallel to each other. The respective trenches 6 may be formed in an oval shape in which both the leading ends of the respective trenches 6 are coupled to each other in an arc shape as two adjacent trenches of which are paired, or may be formed in a striped shape in which the respective trenches 6 are arranged in strips.

Further, the inner wall surface of the trench 6 is covered with a gate oxide film 7, and the interior of the trench 6 is embedded with a gate electrode 8 which is formed on a surface of the gate oxide film 7, and made of doped Poly-Si. The gate oxide film 7 is formed by thermally oxidizing the inner wall surface of the trench 6, and a thickness of the gate oxide film 7 is about 100 nm in both sides of the side surface and the bottom of the trench 6. The trench gate structure 9 is configured as described above.

A source electrode 11 and a gate line (not shown) are formed over the $n^+$ type source region 4, and a surface of the $p^+$ type contact layers 5, and a surface of the gate electrode 8 through an interlayer insulating film 10. The source electrode 11 and the gate line are made of plural metals (for example, Ni/Al), and a part of the source electrode 11 and the gate line which contact with at least n type SiC (specifically, the $n^+$ type source region 4 or the n-doped gate electrode 8) is made of metal that can come in ohmic contact with the n type SiC. A part of the source electrode 11 and the gate line which contact with at least p type SiC (specifically, the $p^+$ type contact layer 5 or the p-doped gate electrode 8) is made of metal that can come in ohmic contact with the p type SiC. The source electrode 11 and the gate line are formed on the interlayer insulating film 10 so as to be electrically isolated from each other. The source electrode 11 comes in electric contact with the $n^+$ type source region 4 and the $p^+$ type contact layer 5 through contact holes formed in the interlayer insulating film 10, and the gate line comes in electric contact with the gate electrode 8.

A drain electrode 12 electrically connected to the $n^+$ type substrate 1 is formed on a rear side of the $n^+$ type substrate 1. With the above structure, the MOSFET having the inversion type trench gate structure 9 of the n channel type is configured.

In the MOSFET of the inversion type trench gate structure 9, the inversion type channel is not formed in the p type base region 3 in a state before a gate voltage is applied to the gate electrode 8. Therefore, even if a positive voltage is applied to the drain electrode 12, electrons cannot reach the p type base region 3 from the $n^+$ type source region 4, and no current flows between the source electrode 11 and the drain electrode 12.

When a desired gate voltage is applied to the gate electrode 8, the inversion type channel is formed on a surface of the p type base region 3 which comes in contact with the trench 6. For that reason, electrons implanted from the source electrode 11 reach the $n^-$ type drift layer 2 after having passed through the channel formed from the $n^+$ type source region 4 to the p type base region 3. With the above configuration, a current is allowed to flow between the source electrode 11 and the drain electrode 12.

Subsequently, a method of manufacturing the MOSFET with the trench gate structure 9 illustrated in FIG. 1 will be described with reference to FIG. 2A to FIG. 2E.

Figure 2A:
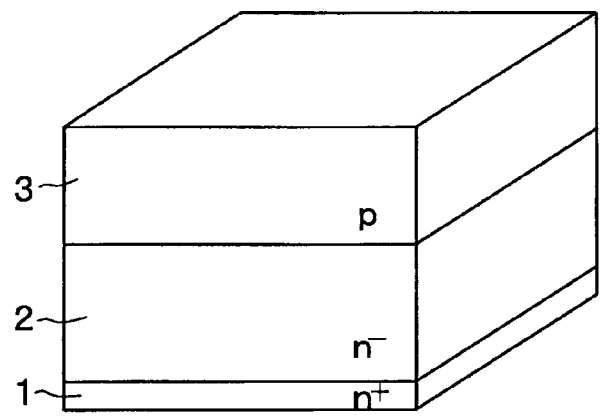
FIG. 2A is a cross-sectional perspective view partially illustrating a process of manufacturing the SiC semiconductor device illustrated in FIG. 1.

In a process illustrated in FIG. 2A, the n$^+$ type substrate 1 is formed of an SiC substrate provided with an off angle with respect to the (0001) plane, in which an n type impurity concentration such as nitrogen is, for example, $1.0 \times 10^{19}/\text{cm}^3$, and a thickness is about 300 µm. An n$^-$ type drift layer 2 made of SiC which is, for example, $3.0 \times 10^{15}$ to $2.0 \times 10^{16}/\text{cm}^3$ in n type impurity concentration such as nitrogen, and about 15 µm in thickness is allowed to epitaxially grow on a surface of the n$^+$ type substrate 1 to form an epitaxial substrate. Then, the p type base region 3 that is for example, $1.0 \times 10^{16}$ to $2.0 \times 10^{19}/\text{cm}^3$ in p type impurity concentration such as boron or aluminum, and about 2.0 µm in thickness is formed on the surface layer portion of the n$^-$ type drift layer 2 by ion implantation of p type impurities such as boron or aluminum.

Figure 2B:
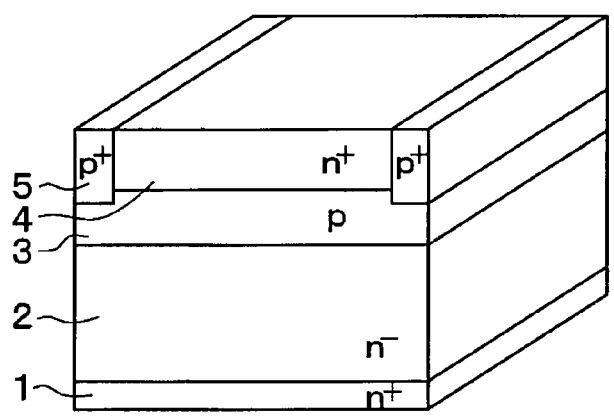
FIG. 2B is a cross-sectional perspective view partially illustrating the process of manufacturing the SiC semiconductor device illustrated in FIG. 1.

In a process illustrated in FIG. 2B, a mask (not shown) made of, for example, a low temperature oxide (LTO) film is formed on the p type base region 3, and thereafter the mask is opened in an area where the n$^+$ type source region 4 is to be formed through a photolithography process. Thereafter, n type impurities (for example, nitrogen) are ion-implanted.

Further, after the mask used previously has been removed, another mask (not shown) is again formed, and the mask is opened in a region where the p$^+$ type contact layer 5 is to be formed through the photolithography process. Thereafter, p type impurities (for example, boron or aluminum) are ion-implanted.

Then, implanted ions are activated. The n$^+$ type source region 4 which is, for example, $1.0 \times 10^{21}/\text{cm}^3$ in n type impurity concentration (surface concentration) such as nitrogen, and about 0.3 µm in thickness is formed. The p$^+$ type contact layer 5 which is, for example, $1.0 \times 10^{21}/\text{cm}^3$ in p type impurity concentration (surface concentration) such as boron or aluminum, and about 0.3 µm in thickness is formed. Thereafter, the mask is removed.

Figure 2C:
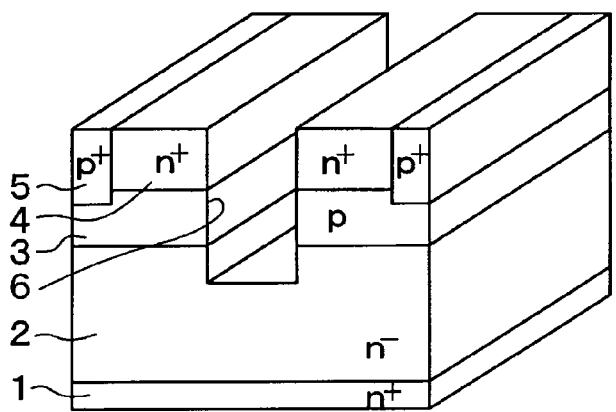
FIG. 2C is a cross-sectional perspective view partially illustrating the process of manufacturing the SiC semiconductor device illustrated in FIG. 1.

In a process illustrated in FIG. 2C, after an etching mask not shown has been formed on the p type base region 3, the n$^+$ type source region 4, and the p$^+$ type contact layer 5, the etching mask is opened in an area where the trench 6 is to be formed. Then, a trench etching process is conducted with the use of the etching mask to form the trench 6. As a result, the trench 6 in which the longitudinal direction of which matches the off-axis direction is formed.

At this time, the trench 6 is formed toward the (11-20) plane or the (1-100) plane so that each of the side wall surfaces of the trench 6 is intended for forming substantially the (11-20) plane or the (1-100) plane, and a trench etching condition is set so that the angle formed by the side wall surface with respect to the bottom surface of the trench 6 is, for example, 87 degrees. For that reason, when the respective trenches 6 are formed in an oval shape in which both the leading ends of the respective trenches 6 are coupled to each other, in the leading end of one trench 6, the angle formed between the (0001) plane and the side wall surface of the outer peripheral side becomes 83 degrees, and the angle formed between the (0001) plane and the side wall surface of the inner peripheral side becomes 91 degrees (refer to FIG. 6C). Also, in the leading end of another trench 6, the angle formed between the (0001) plane and the side wall surface of the outer peripheral side becomes 91 degrees, and the angle formed between the (0001) plane and the side wall surface of the inner peripheral side becomes 83 degrees (refer to FIG. 6D). Thereafter, the etching mask is removed.

Figure 2D:
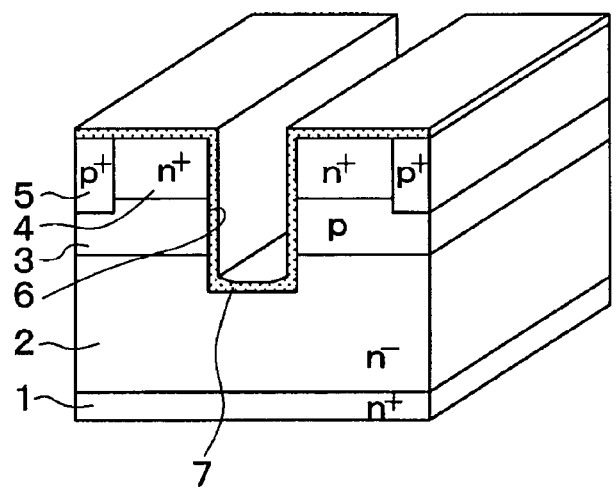
FIG. 2D is a cross-sectional perspective view partially illustrating the process of manufacturing the SiC semiconductor device illustrated in FIG. 1.

In a process illustrated in FIG. 2D, the gate oxide film 7 is formed by deposition without performing the sacrificial oxidation process as it is, after the damage removal process has been conducted by CDE using gas containing, for example, CF$_4$ and O$_2$ therein after the formation of the trench 6. In this situation, when sacrificial oxidation is conducted, accelerated oxidation is performed because the n$^+$ type source region 4 is higher in impurity concentration than the p type base region 3. However, because the sacrificial oxidation process is not performed, the accelerated oxidation is not performed. For that reason, the step in the boundary position between the n$^+$ type source region 4 and the p type base region 3 becomes as small as 10 nm or lower, in the side wall surface of the trench 6.

Figure 2E:
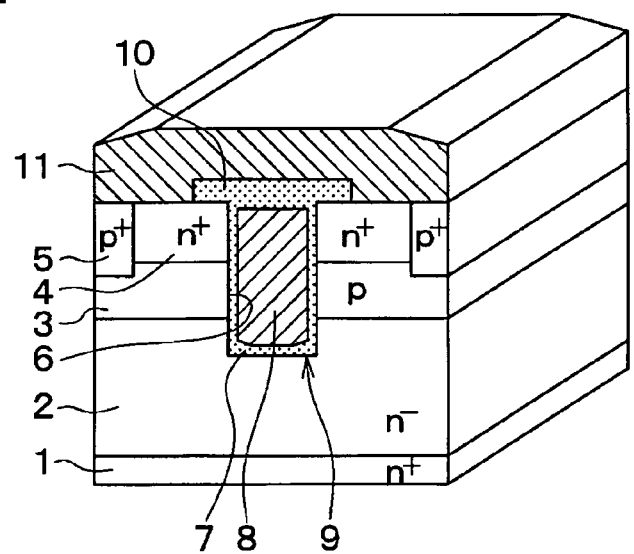
FIG. 2E is a cross-sectional perspective view partially illustrating the process of manufacturing the SiC semiconductor device illustrated in FIG. 1.

In a process illustrated in FIG. 2E, a polysilicon layer doped with n type impurities is formed in about 440 nm on the surface of the gate oxide film 7, for example, at a temperature of 600° C., and therefore an etch-back process or the like is conducted, to thereby leave the gate oxide film 7 and the gate electrode 8 within the trench 6.

Also, after the interlayer insulating film 10 has been formed, the interlayer insulating film 10 is patterned to form the contact holes connected to the n$^+$ type source region 4 and the p$^+$ type contact layer 5. Also, the contact hole connected to the gate electrode 8 is formed in another cross section. Subsequently, after an electrode material film is formed to be embedded within the contact holes, the electrode material is patterned to form the source electrode 11 and the gate line. Thereafter, although not shown, the drain electrode 12 is formed on a rear surface side of the n$^+$ type substrate 1 to complete the MOSFET illustrated in FIG. 1.

As described above, in this embodiment, the gate oxide film 7 is formed without performing sacrificial oxidation process after formation of the trench 6. For that reason, the SiC semiconductor device can be provided without being affected by the sacrificial oxidation process, can suppress leakage current from being generated partially in the trench gate structure 9, and is higher in reliability of the gate oxide film 7. Also, in the case of forming the trench gate structure 9 without performing the sacrificial oxidation process in this manner, the barrier height φB in all the inner wall surfaces of the trench 6 becomes 2.7 eV, and the barrier height φB that can suppress the occurrence of leakage current in both the leading ends of the trench 6 can be obtained.

Figure 3:
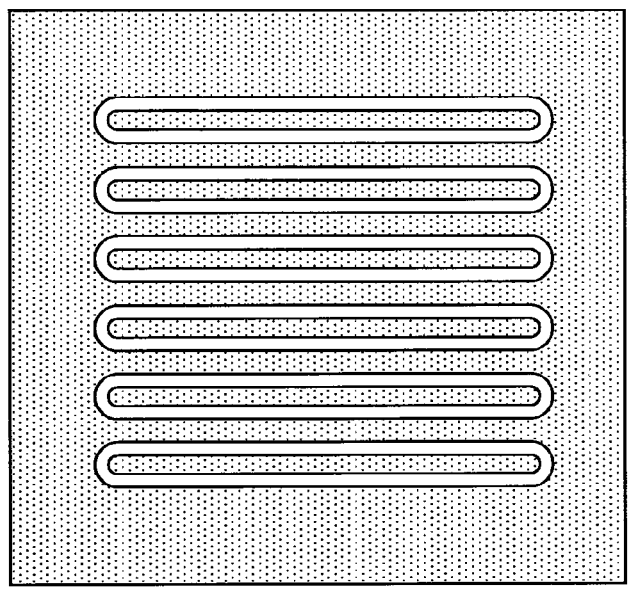
FIG. 3 is a diagram illustrating the results of examining an emission image when implementing only a chemical dry etching after forming a trench.

For reference, the leakage characteristics when only CDE is performed, and the sacrificial oxidation process is not performed after the trench 6 has been formed are investigated by confirming the emission image while the gate voltage gradually increases in a state where the source electrode 11 and the drain electrode 12 are connected to GND. Specifically, the trench gate structure 9 is laid out as in FIG. 4 to conduct examination. As a result, as shown in FIG. 3, that the leakage current is generated when the gate voltage increases to some extent, and leakage current is generated over the entire region of the trench gate structure 9 was confirmed. The gate voltage at which the leakage current occurs is greater than that in the case of forming the gate oxide film 7 immediately after the sacrificial oxidation process. From this fact, the leakage current can be restricted from being generated on only both the leading ends of the trench 6, and it is found that a uniform breakdown voltage is obtained over the entire region of the trench 6.

(Other Embodiments)

In the above embodiment, the SiC substrate in which the main surface of which has the off angle with respect to the (0001) plane is used as the n+ type substrate 1. Alternatively, an SiC substrate in which a main surface of which has an off angle with respect to the (000-1) plane may be used. As an example, a case in which the off angle is 4 degrees is described. Alternatively, another angle, for example, 2 degrees may be employed. Further, an SiC substrate having a just plane of the (0001) plane or the (000-1) plane as the main surface can be used as the n+ type substrate 1.

That is, when the gate oxide film 7 is formed within the trench 6 after performing the sacrificial oxidation process, the angle formed by the side wall surface in which the channel region is formed in the side wall surface of the trench 6 with respect to the (0001) plane (or the (000-1) plane) becomes 83 degrees or smaller, the leakage current increases. On the contrary, it can be confirmed that the generation of the leakage current can be suppressed when the angle of the side wall surface of the trench 6 is set to 84 degrees or larger, and preferably if the angle is set to 87 degrees, the generation of the leakage current can be further suppressed.

Therefore, when the sacrificial oxidation process is not performed, the generation of the leakage current can be suppressed even if the angle with respect to the (0001) plane (or the ((000-1) plane) becomes 83 degrees or smaller, regardless of the off angle. Also, when the sacrificial oxidation process is performed, if, in the side wall surface of the trench 6, at least the side wall surface on which the channel region is formed has an angle of 84 degrees or larger, the generation of the leakage current can be suppressed. For that reason, forming the gate oxide film 7 without performing the sacrificial oxidation process is effective in a case where, in the side wall surface of the trench 6, at least the side wall surface on which the channel region is formed has an angle of smaller than 84 degrees with respect to the (0001) plane (or the (000-1) plane). Also, when the sacrificial oxidation process is performed, if, in the side wall surface of the trench 6, at least the side wall surface on which the channel region is formed has an angle of 84 degrees or larger, the generation of the leakage current can be suppressed. As a result, the trench 6 may be formed for the angle. Specifically, in the case of using an SiC substrate having the off angle of 4 degrees, the angle of the side wall surface on which a channel region is formed with respect to the bottom surface of the trench 6 may be set to 88 degrees or larger. Also, in the case of using an SiC substrate having the off angle of 2 degrees, the angle of the side wall surface on which a channel region is formed with respect to the bottom surface of the trench 6 may be set to 86 degrees or larger. In the case of using an SiC substrate having the off angle of 0 degrees, that is, a just plane of the (0001) plane or the (000-1) plane as the main surface, the angle of at least the side wall surface on which the channel region is formed with respect to the bottom surface of the trench 6 may be set to 84 degrees or larger.

In addition, even if the sacrificial oxidation process is performed, if not the gate oxide film 7 is formed immediately after that, but the gate oxide film 7 is formed after the damage removal process is performed by the CDE, the generation of the leakage current can be suppressed. For that reason, even if the sacrificial oxidation process is performed, the process of forming the gate oxide film 7 is prevented from being conducted immediately after the sacrificial oxidation process, as a result of which the generation of the leakage current can be suppressed.

In the above embodiment, the trench gate structure 9 is laid out with one direction as the longitudinal direction. However, this merely shows an example of the trench gate structure 9, and the trench gate structure 9 can be designed in a rectangular or hexagonal layout. Even in this case, if the angle formed by the side wall surface of the trench 6 with respect to the (0001) plane or the (000-1) plane is smaller than 84 degrees, the sacrificial oxidation process is not conducted, or the sacrificial oxidation process is not conducted immediately before the formation of the gate oxide film 7 even if such a process is conducted. As a result, the leakage current suppression effects can be obtained. Also, in the side wall surface of the trench 6, when at least the side wall surface on which the channel region is formed has an angle of 84 degrees or larger with respect to the (0001) plane or the (000-1) plane, even if the sacrificial oxidation process is conducted, the leakage current suppression effects are obtained.

In the above embodiment, the MOSFET of the n channel type in which the first conductivity type is n type, and the second conductivity type is p type has been described as an example. Alternatively, the present invention can be applied to the MOSFET of the p channel type in which the conductivity type of the respective components is reversed. Also, in the above description, the MOSFET of the trench gate structure has been described as an example, the present invention can be applied to the IGBT having the same trench gate structure. The IGBT changes the conductivity type of the substrate 1 from the n type to the p type in the embodiment, and other structures and the manufacturing method are identical with those in the above embodiment.

In the above embodiment, an example to which the present disclosure is applied have been described. However, a design can be appropriately changed. For example, in the above embodiment, the gate oxide film 7 obtained by depositing the oxide film is exemplified as an example of the gate insulating film. Alternatively, the gate oxide film 7 may be formed by thermal oxidation, or may include a nitride film. When the gate oxide film 7 is formed by thermal oxidation, accelerated oxidation of the n+ type source region 4 is performed. However, it is confirmed that if the sacrificial oxidation process is not performed immediately before formation of the gate oxide film 7, the leakage current suppression effect is obtained. For that reason, the gate oxide film 8 may be formed by thermal oxidation. However, in that case, the step in the boundary position between the n+ type source region 4 and the p type base region 3 does not become 10 nm or smaller, but may be slightly larger than 10 nm in the side wall surface of the trench 6.

In the case of indicating the crystal orientation, a bar (-) should be originally attached above a desired number, but because the restricted expression exists based on computer applications, the bar is attached in front of the desired number in the present specification. In this specification, in the expressions that the process of forming the gate oxide film 7 is not performed immediately after the sacrificial oxidation process, or the sacrificial oxidation process is not performed immediately before the gate oxide film 7, phrases such as "immediately after" or "immediately before" are used. In the present specification, "immediately after" and "immediately before" do not mean just in time, but mean that another process does not enter between the respective processes. For that reason, "immediately after the sacrificial oxidation process" means that the process of forming the gate oxide film 7 follows after the sacrificial oxidation process without any interposition of another process, but a case where the damage removal process by CDE enters halfway is excluded.

The invention claimed is:

1. A method of manufacturing a silicon carbide semiconductor device having an inversion type vertical switching element with a trench gate structure, the silicon carbide semiconductor device including:
   a substrate of a first or second conductivity type which is made of silicon carbide, a main surface of which is a (0001) plane or a (000-1) plane, or has an off angle with respect to the (0001) plane or the 000-1) plane;
   a drift layer formed on the substrate, and made of silicon carbide of the first conductivity type which is lower in impurity concentration than the substrate;
   a base region formed on the drift layer, and made of silicon carbide of the second conductivity type;
   a source region formed on an upper portion of the base region, and made of silicon carbide of the first conductivity type which is higher in concentration than the drift layer;
   a trench that is formed from a surface of the source region to a depth reaching the drift layer through the base region, and a side wall surface of which is formed toward a (11-20) plane or a (1-100) plane;
   a gate insulating film formed on an inner wall surface of the trench;
   a gate electrode formed on the gate insulating film within the trench;
   a source electrode electrically connected to the source region and the base region; and
   a drain electrode formed on a rear surface side of the substrate,
   wherein an applied voyage to the gate electrode is controlled to form a channel region of the inversion type on a surface portion of the base region located on a side surface of the trench, and a current is allowed to flow between the source electrode and the drain electrode through the source region and the drift layer,
   the method of manufacturing the silicon carbide semiconductor device comprising:
   (a) forming the trench by etching;
   (b) performing sacrificial oxidation by forming a sacrificial oxide film and removing the sacrificial oxide film after forming the trench and prior to and without any step removing damage formed in the step (a);
   (c) performing a damage removing step to remove damage formed during the step (a) of forming the trench by etching, the damage removing step including chemical dry etching using a gas containing CF4 and $O_2$ to remove the damage resulting from the step (a); and
   (d) forming the gate insulating film on the surface of the trench without performing sacrificial oxidation after removing the damage,
   wherein the steps (a), (b), (c) and (d) are carried out in sequence without any intervening processing steps.

2. A method of manufacturing a silicon carbide semiconductor device having an inversion type vertical switching element with a trench gate structure according to claim 1,
   wherein at least the side wall surface of the trench on which a channel region is formed having an angle of 84 degrees or larger with respect to the (0001) plane or the (000-1) plane.

3. A method of manufacturing a silicon carbide semiconductor device having an inversion type vertical switching element with a trench gate structure according to claim 1,
   wherein the trench has a step at a boundary position between the source region and the base region in the side wall surface being 10 nm or smaller.

4. The method of manufacturing a silicon carbide semiconductor device having an inversion type vertical switching element according to claim 3,
   wherein the trench includes a portion in which the angle with respect to the (0001) plane or the (000-1) plane is smaller than 84 degrees as at least a part of the side wall surface.

5. The method of manufacturing a silicon carbide semiconductor device having an inversion type vertical switching element according to claim 2,
   wherein the substrate is a substrate having the off angle, and wherein the trench is formed with one direction as a longitudinal direction, and the longitudinal direction matches an off-axis direction of the substrate.

* * * * *